US010890684B2

United States Patent
Reiderman et al.

(10) Patent No.: US 10,890,684 B2
(45) Date of Patent: Jan. 12, 2021

(54) DOWNHOLE NUCLEAR MAGNETIC RESONANCE SENSOR USING ANISOTROPIC MAGNETIC MATERIAL

(71) Applicant: Halliburton Energy Services, Inc., Houston, TX (US)

(72) Inventors: Arcady Reiderman, Katy, TX (US); Lilong Li, Humble, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 350 days.

(21) Appl. No.: 15/112,031

(22) PCT Filed: Feb. 9, 2016

(86) PCT No.: PCT/US2016/017069
§ 371 (c)(1),
(2) Date: Jul. 15, 2016

(87) PCT Pub. No.: WO2016/144460
PCT Pub. Date: Sep. 15, 2016

(65) Prior Publication Data
US 2017/0010378 A1 Jan. 12, 2017

Related U.S. Application Data

(60) Provisional application No. 62/131,339, filed on Mar. 11, 2015.

(51) Int. Cl.
*G01R 33/38* (2006.01)
*G01V 3/32* (2006.01)
(Continued)

(52) U.S. Cl.
CPC .............. *G01V 3/32* (2013.01); *E21B 47/00* (2013.01); *G01R 33/383* (2013.01);
(Continued)

(58) Field of Classification Search
CPC ........ G01V 3/32; G01V 3/14; G01R 33/3808; G01R 33/383; G01R 33/3678; E21B 47/00
(Continued)

(56) References Cited

U.S. PATENT DOCUMENTS 3,187,284 A * 6/1965 Rinia .................. H01F 29/10
336/135
4,629,986 A 12/1986 Clow et al.
(Continued)

FOREIGN PATENT DOCUMENTS

EP 0932055 A2 7/1999
WO 02084332 A1 10/2002

OTHER PUBLICATIONS

ISR/WO for PCT/US2016/017069 dated May 17, 2016.
European Application Serial No. 16762097.0; Extended European Search Report; dated Dec. 19, 2018, 8 pages.

*Primary Examiner* — Farhana A Hoque
*Assistant Examiner* — Courtney G McDonnough
(74) *Attorney, Agent, or Firm* — Gilliam IP PLLC

(57) ABSTRACT

A nuclear magnetic resonance (NMR) sensor including a magnet that generates a static magnetic field, a soft magnetic core secured to the magnet, and an antenna extending at least partially about the soft magnetic core and generating a radio frequency (RF) magnetic field. A magnetic permeability of the soft magnetic core in a direction of the static magnetic field is less than the magnetic permeability of the soft magnetic core in a direction of the RF magnetic field.

26 Claims, 5 Drawing Sheets

(51) Int. Cl.
*E21B 47/00* (2012.01)
*G01R 33/383* (2006.01)
*G01V 3/14* (2006.01)
*G01R 33/36* (2006.01)

(52) U.S. Cl.
CPC .......... *G01R 33/3808* (2013.01); *G01V 3/14* (2013.01); *G01R 33/3678* (2013.01)

(58) Field of Classification Search
USPC ........................................................ 324/303
See application file for complete search history.

(56) References Cited

U.S. PATENT DOCUMENTS

| | | | |
|---|---|---|---|
| 5,280,243 A | 1/1994 | Miller | |
| 5,557,201 A | 9/1996 | Kleinberg et al. | |
| 6,018,243 A * | 1/2000 | Taicher | G01V 3/32 324/300 |
| 6,348,792 B1 | 2/2002 | Beard et al. | |
| 6,452,388 B1 * | 9/2002 | Reiderman | G01N 24/081 324/303 |
| 6,534,980 B2 | 3/2003 | Toufaily et al. | |
| 6,580,273 B2 | 6/2003 | Reiderman et al. | |
| 2001/0045829 A1 * | 11/2001 | Prammer | G01V 3/32 324/303 |
| 2002/0022699 A1 | 2/2002 | Kuriyama et al. | |
| 2005/0189945 A1 * | 9/2005 | Reiderman | G01V 3/28 324/333 |
| 2006/0255799 A1 | 11/2006 | Reiderman | |
| 2007/0182408 A1 * | 8/2007 | Blanz | E21B 49/00 324/303 |
| 2007/0222444 A1 * | 9/2007 | Reiderman | G01N 24/081 324/303 |
| 2009/0072825 A1 * | 3/2009 | Prammer | G01N 24/081 324/303 |
| 2015/0061664 A1 | 3/2015 | Reiderman et al. | |
| 2015/0061665 A1 | 3/2015 | Reiderman et al. | |
| 2015/0115965 A1 * | 4/2015 | Reiderman | G01V 3/10 324/339 |

* cited by examiner

US 10,890,684 B2

DOWNHOLE NUCLEAR MAGNETIC RESONANCE SENSOR USING ANISOTROPIC MAGNETIC MATERIAL

CROSS-REFERENCE TO RELATED APPLICATIONS

This application claims priority under 35 U.S.C. § 119 to Provisional Application No. 62/131,339 filed on Mar. 11, 2015, in the United States Patent and Trademark Office.

BACKGROUND

Well logging instruments used in the oil and gas industry often employ nuclear magnetic resonance (NMR) downhole sensor assemblies for determining properties of subterranean earth formations including, among other things, the fractional volume of pore space, the fractional volume of mobile fluid filling the pore space and other petrophysical parameters. Existing NMR downhole sensor assemblies use soft magnetic materials to improve efficiency and shield the NMR magnet assembly from the NMR antenna. While increasing the efficiency of the NMR antenna in producing the radio frequency (RF) magnetic field, the soft magnetic material also affects the static magnetic field distribution in a volume of investigation. The soft magnetic material can produce undesired reduction of the static magnetic field in the volume of investigation depending on a position and shape of the soft magnetic material. This reduction requires a larger magnet (e.g., having a larger cross-sectional area) to achieve a desired magnetic field strength of the static magnetic field.

In existing configurations, the soft magnetic core partly closes (or shorts) the magnetic flux and therefore reduces the magnetic field in the volume of investigation. Another existing configuration employs longitudinal dipole type magnets for generating a static magnetic field and orthogonal transversal-dipole antennae for generating a radio frequency (RF) magnetic field to generate excitation and for acquiring NMR signals. The static magnetic field produced in this configuration is restricted due to the soft magnet core, which is typically in a shape of a cylindrical shell elongated in an axial direction. The soft magnetic core results in a reduced static magnetic field and a reduced excitation frequency of the magnetic field in the volume of investigation, and the lower excitation frequency increases dead time of the measurement and the SNR.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, without departing from the scope of this disclosure.

DETAILED DESCRIPTION

Embodiments of the disclosure are directed to NMR downhole tools that utilize an anisotropic soft magnetic material having a lower magnetic permeability in the direction of the static magnetic field as compared to the magnetic permeability in the direction of the radio frequency (RF) magnetic field. Such NMR tools have a higher signal-to-noise ratio (SNR) (e.g., for a given DC power budget) and a reduced power consumption. The reduced magnetic permeability in the direction of the static magnetic field may increase the static magnetic field strength in a volume of investigation. The relatively higher magnetic field and, therefore, the relatively higher NMR frequency, may reduce the dead time of measurement, and reduced dead time may enable resolving a shorter relaxation time of the NMR signal and may increase SNR per unit time. NMR tools utilizing the anisotropic soft magnetic material may advantageously require smaller magnets (e.g., magnets having a reduced cross-sectional area) and, therefore, may make NMR tools cheaper and relatively more robust.

Figure 1:
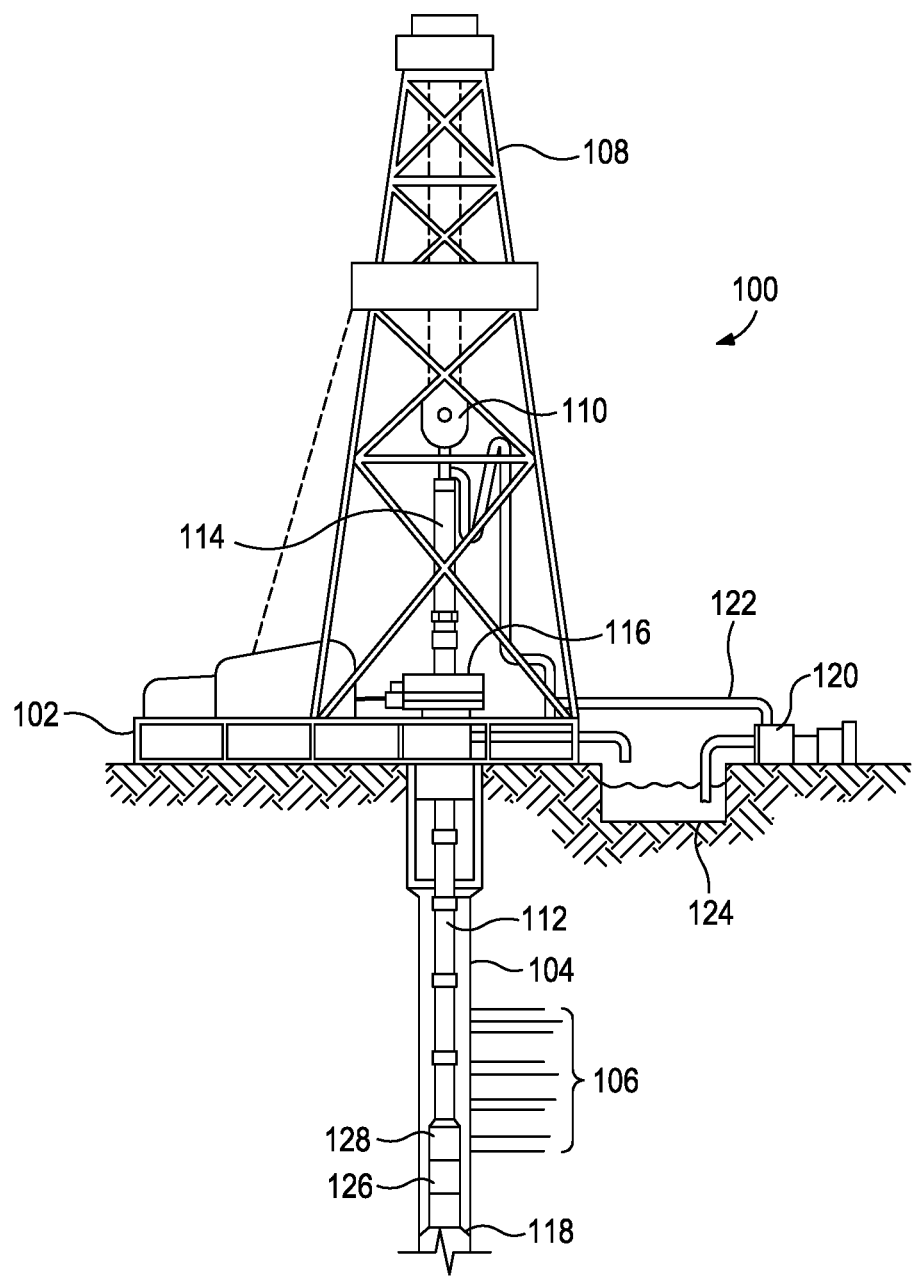
FIG. 1 is a schematic diagram of an exemplary drilling system that may employ the principles of the present disclosure.

FIG. 1 is a schematic diagram of an exemplary drilling system 100 that may employ the principles of the present disclosure, according to one or more embodiments. As illustrated, the drilling system 100 may include a drilling platform 102 positioned at the Earth's surface and a wellbore 104 that extends from the drilling platform 102 into one or more subterranean formations 106. In other embodiments, such as in an offshore drilling operation, a volume of water may separate the drilling platform 102 and the wellbore 104.

The drilling system 100 may include a derrick 108 supported by the drilling platform 102 and having a traveling block 110 for raising and lowering a drill string 112. A kelly 114 may support the drill string 112 as it is lowered through a rotary table 116. A drill bit 118 may be coupled to the drill string 112 and driven by a downhole motor and/or by rotation of the drill string 112 by the rotary table 116. As the drill bit 118 rotates, it creates the wellbore 104, which penetrates the subterranean formations 106. A pump 120 may circulate drilling fluid through a feed pipe 122 and the kelly 114, downhole through the interior of drill string 112, through orifices in the drill bit 118, back to the surface via the annulus defined around drill string 112, and into a retention pit 124. The drilling fluid cools the drill bit 118 during operation and transports cuttings from the wellbore 104 into the retention pit 124.

The drilling system 100 may further include a bottom hole assembly (BHA) coupled to the drill string 112 near the drill bit 118. The BHA may comprise various downhole measurement tools such as, but not limited to, measurement-while-drilling (MWD) and logging-while-drilling (LWD) tools, which may be configured to take downhole measurements of drilling conditions. The MWD and LWD tools may include at least one logging tool 126, which may comprise a nuclear magnetic resonance (NMR) logging tool or sensor.

As the drill bit 118 extends the wellbore 104 through the formations 106, the logging tool 126 may collect NMR measurements of the surrounding subterranean formations 106. The logging tool 126 and other sensors of the MWD and LWD tools may be communicably coupled to a telemetry module 128 used to transfer measurements and signals from the BHA to a surface receiver (not shown) and/or to receive commands from the surface receiver. The telemetry module 128 may encompass any known means of downhole communication including, but not limited to, a mud pulse telemetry system, an acoustic telemetry system, a wired communications system, a wireless communications system, or any combination thereof. In certain embodiments, some or all of the measurements taken at the logging tool 126 may also be stored within the logging tool 126 or the telemetry module 128 for later retrieval at the surface upon retracting the drill string 112.

Figure 2:
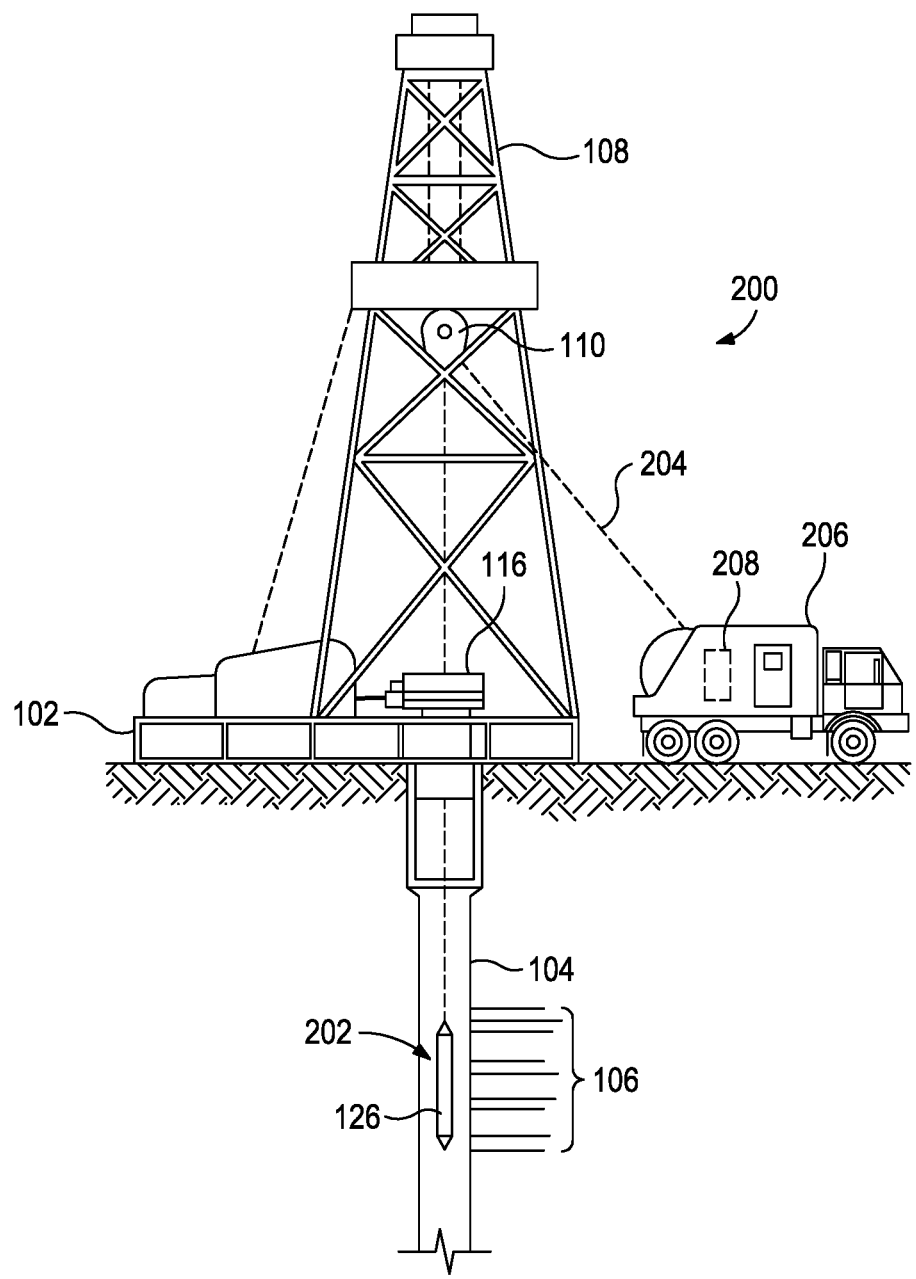
FIG. 2 depicts a schematic diagram of an exemplary wireline system that may employ the principles of the present disclosure.

At various times during the drilling process, the drill string 112 may be removed from the wellbore 104, as shown in FIG. 2, to conduct measurement/logging operations. More particularly, FIG. 2 depicts a schematic diagram of an exemplary wireline system 200 that may employ the principles of the present disclosure, according to one or more embodiments. Like numerals used in FIGS. 1 and 2 refer to the same components or elements and, therefore, may not be described again in detail. As illustrated, the wireline system 200 may include a wireline instrument sonde 202 that may be suspended into the wellbore 104 by a cable 204, such as a wireline or slickline. The wireline instrument sonde 202 may include the logging tool 126, which may be communicably coupled to the cable 204. The cable 204 may include conductors for transporting power to the wireline instrument sonde 202 and also facilitate communication between the surface and the wireline instrument sonde 202. A logging facility 206, shown in FIG. 2 as a truck, may collect measurements from the logging tool 126, and may include computing facilities 208 for controlling, processing, storing, and/or visualizing the measurements gathered by the logging tool 126. The computing facilities 208 may be communicably coupled to the logging/measurement tool 126 by way of the cable 204.

Figure 3:
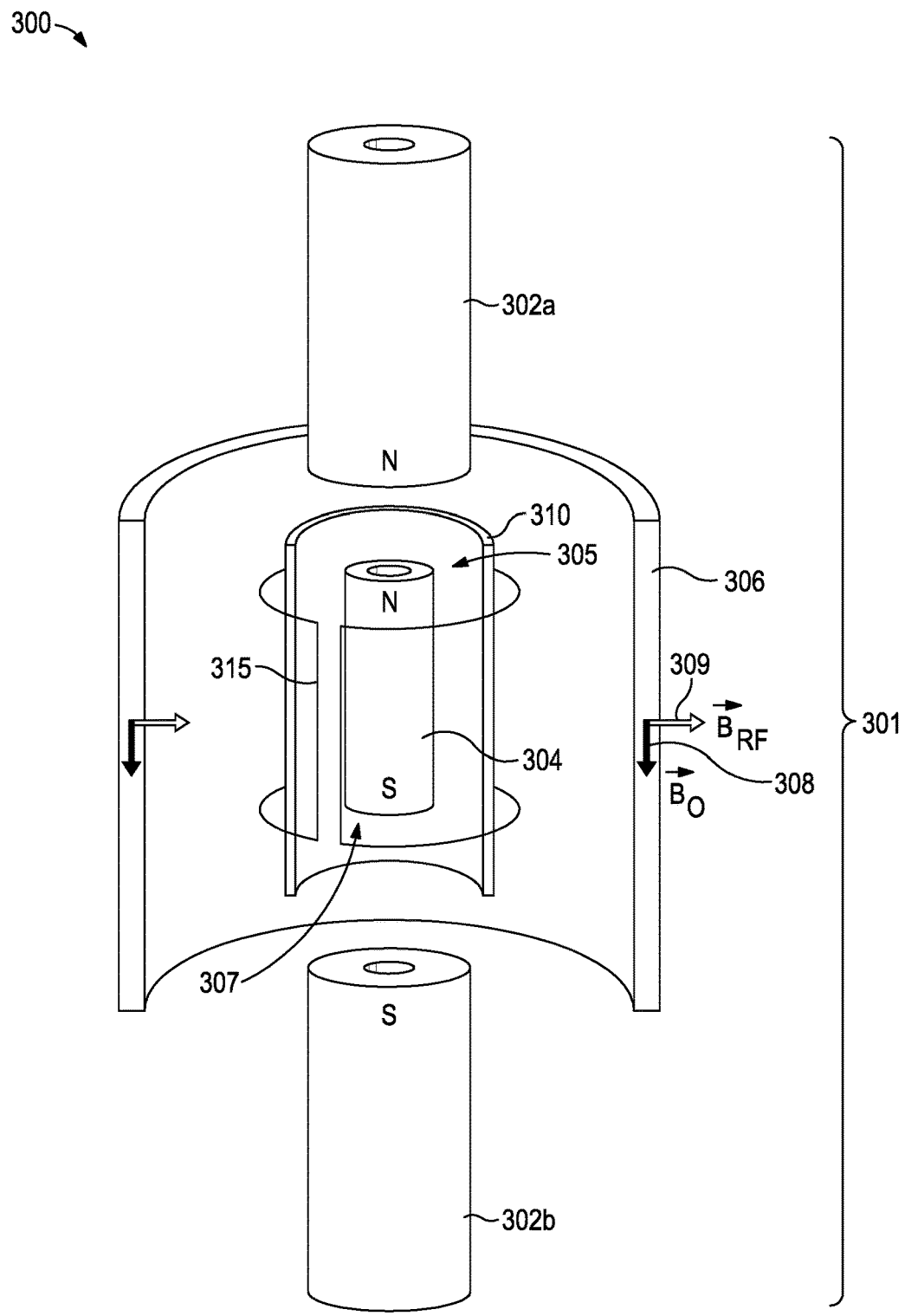
FIG. 3 illustrates an exploded view of an exemplary NMR sensor that may be used in the logging tool of FIG. 1 for obtaining NMR data from the surrounding subterranean formations.

FIG. 3 illustrates an exploded view of an exemplary NMR sensor 300 that may be used in the logging tool 126 of FIG. 1 for obtaining NMR data from the surrounding subterranean formations 106. Although the NMR sensor 300 is disclosed as being used in the drilling system 100 in FIG. 1, one of skill in the art will appreciate that the NMR sensor 300 can also be used in the wireline system 200 (FIG. 2) and other desired wellbore systems, without departing from the scope of the disclosure. The NMR data can be processed to identify physical properties of the formations 106 or to extract other types of information. For example, the NMR data may be processed to identify the porosity of the formation 106, properties of the pore fluids, and other desired properties of the formations 106.

As illustrated in FIG. 3, the NMR sensor 300 includes a magnet 301 that includes first and second magnetic end pieces 302a and 302b and a central magnetic piece 304 that interposes the first and second magnetic end pieces 302a,b for generating a static magnetic field $\vec{B_0}$ having a desired shape and field strength. In any example, the central magnetic piece 304 and the first and second magnetic end pieces 302a and 302b may each comprise one or more permanent magnetic pieces. As illustrated, the central magnetic piece 304 may be an elongate magnetic piece having a first axial end 305 and a second, opposite axial end 307. The first magnetic end piece 302a may be axially offset a short distance from the first axial end 305 of the central magnetic piece 304, and the second magnetic end piece 302b may be axially offset a short distance from the second axial end 307 of the central magnetic piece 304. While each of the magnetic pieces 302a,b and 304 are depicted as generally cylindrical structures, it should be noted that the shape of the magnetic pieces 302a,b and 304 is not limited to any particular shape and each of the magnetic pieces 302a,b and 304 may alternatively exhibit any desired shape, without departing from the scope of the disclosure.

The static magnetic field $\vec{B_0}$ is generated in a volume of investigation 306 (e.g., a desired volume of the formation 106) and the direction thereof is parallel to the longitudinal axis of the wellbore, as generally indicated by the arrow 308. It should be noted that the volume of investigation 306 forms a complete cylinder about the magnet 301. However, for the sake of clarity of illustration, a cutaway view of the volume of investigation 306 is shown in FIG. 3 so that the internal components of the magnet 301 can be viewed. It should also be noted that the volume of investigation 306 is not restricted to any particular shape or size, and the shape and size thereof can be varied as required by the application or design. The first and second magnetic end pieces 302a and 302b together with the central magnetic piece 304 cooperatively define four magnetic poles, which may be arranged to shape or/and enhance the static magnetic field $\vec{B_0}$ in the volume of investigation 306.

The NMR sensor 300 also includes a transversal-dipole antenna 315 that extends at least partially about the circumference of a portion of the magnet 301. The transversal-dipole antenna 315 may operate by generating a radio frequency (RF) magnetic field $\vec{B_{RF}}$ that results in NMR excitation of the formation 106, and may further acquire NMR signals representative of the NMR conditions in the formation 106. As illustrated, the direction of the RF magnetic field $\vec{B_{RF}}$ is orthogonal to the static magnetic field $\vec{B_0}$, generally indicated by the arrow 309.

The transversal-dipole antenna 315 is positioned on the magnet 301 and, more specifically, secured to a soft magnetic core 310 of the magnet 301. For instance, as illustrated, the transversal-dipole antenna 315 may extend about the outer diameter of the soft magnetic core 310. The soft magnetic core 310 is secured to the magnet 301 and, more particularly, to the central magnetic piece 304. In the illustrated embodiment, the soft magnetic core 310 extends about at least some of the outer diameter of the central magnetic piece 304 such that a nested, concentric relationship results. For the purposes of discussion herein, the soft magnetic core 310 is assumed cylindrical in shape. However, the soft magnetic core 310 is not restricted to any particular shape or size, and the shape and size thereof can vary as per application and design requirements. Further, for the sake of clarity of illustration, a cutaway view of the soft magnetic core 310 is shown in FIG. 3 so that the internal components of the magnet 301 can be viewed.

The soft magnetic core 310 is used for RF magnetic flux concentration. The volume of investigation 306 can be made axially long enough and radially wide enough (e.g., 20 cm long, and 0.5 cm wide) to provide immunity or otherwise a decreased sensitivity to axial motion, lateral motion, or both of the logging tool 126 (FIGS. 1 and 2). In any example (not explicitly illustrated), the NMR sensor 300 may include an antenna assembly that may include two mutually orthogonal transversal-dipole antennas. The two mutually orthogonal transversal-dipole antennas may at least partially overlap each other and at least partially circumscribe the soft magnetic core 310. The two mutually orthogonal antennas enable circular polarized excitation and quadrature coil detection in order to increase signal-to-noise ratio and reduce power consumption.

An axially longer sensitivity region may enable measurement while conveying the drill string 112 (FIG. 1) or wireline 204 (FIG. 2) into the wellbore 104 (FIG. 1), or while retrieving the drill string 112 or wireline 204 from the wellbore 104. The sensitivity region can be modified or optimized by shaping the magnetic pieces 302a, 302b, and/or 304, and the material of the soft magnetic core 310. Compared to some example axially-symmetrical designs, the use of the longitudinal-dipole magnetic pieces 302a, 302b, and 304 and the transversal-dipole antenna 315 advantageously results in reduced eddy current losses to the formation 106 and drilling fluid (i.e., "mud") in the wellbore 104 due to a longer eddy current path.

The soft magnetic core 310 may be used to concentrate the flux of RF magnetic field $\vec{B}_{RF}$ generated by the transversal-dipole antenna 315. The flux concentration may result in an increased RF magnetic field $\vec{B}_{RF}$ in the volume of investigation 306 and thereby an increased SNR. The soft magnetic core 310 also electromagnetically shields the magnetic pieces 302a, 302b, and/or 304, or other components of the NMR sensor 300 (and/or the logging tool 126) from the RF magnetic field $\vec{B}_{RF}$ generated by the transversal-dipole antenna 315. As a result, the eddy current losses in the NMR sensor 300 are reduced. This reduction in eddy current may also reduce electromagnetic acoustic ringing, which may cause undesired signal interfering with the generated NMR signals.

The magnetic flux due to the static magnetic field $\vec{B}_0$ generated by the magnetic pieces 302a, 302b, and 304 may be at least partly shorted by the soft magnetic core 310. An amount by which the magnetic flux of the static magnetic field $\vec{B}_0$ is shorted depends on the magnetic permeability of the material of the soft magnetic core 310. The greater the magnetic permeability of the material of the soft magnetic core 310, the greater is the shorting of the magnetic flux of the static magnetic field $\vec{B}_0$. The shorting of the magnetic flux reduces static magnetic field $\vec{B}_0$ in the volume of investigation 306 and also may saturate the soft magnetic core 310 and, therefore, reduce its efficiency. The shorting of the magnetic flux and other undesirable effects may be reduced by using a soft magnetic core 310 having a lower magnetic permeability. However, the lower magnetic permeability material may reduce the efficiency of the transversal-dipole antenna 315 in generating the RF magnetic field $\vec{B}_{RF}$ and reduce the desirable shielding effect provided by the soft magnetic core 310.

Figure 4A:
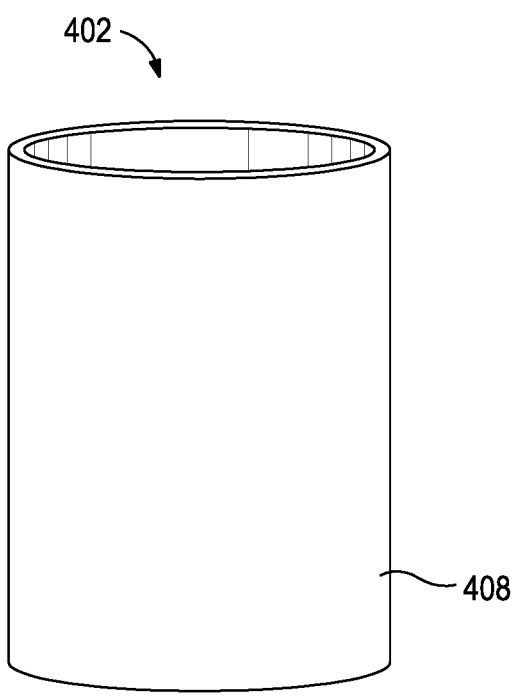
FIGS. 4A and 4B illustrate isometric side views of exemplary soft magnetic cores.
Figure 4B:
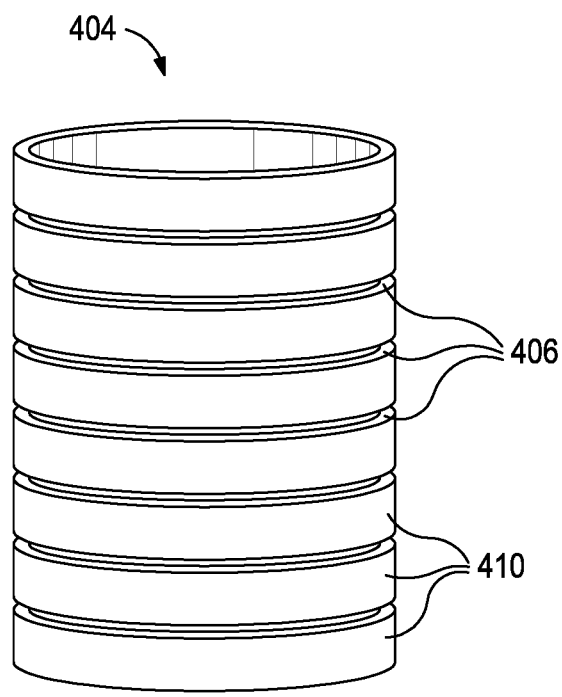

FIGS. 4A and 4B illustrate isometric side views of exemplary soft magnetic cores 402 and 404. The soft magnetic cores 402, 404 may be the same as or similar to the soft magnetic core 310 of FIG. 3 and, therefore, may be used in the NMR sensor 300 of FIG. 3. As illustrated, the soft magnetic cores 402 and 404 are generally cylindrical in shape, although other shapes are also possible. The soft magnetic cores 402 and 404 may exhibit a low magnetic permeability in the direction of the static magnetic field $\vec{B}_0$ as compared to the magnetic permeability in the direction of the RF magnetic field $\vec{B}_{RF}$. The low magnetic permeability in the direction of the static magnetic field $\vec{B}_0$ may reduce an amount by which the soft magnetic cores 402 and 404 short the magnetic flux of the static magnetic field $\vec{B}_0$.

The soft magnetic core 402 may be made of or otherwise include an anisotropic magnetic material 408 having a magnetic permeability that varies with direction. The anisotropy in the magnetic permeability of the material 408 of the soft magnetic core 402 may be an intrinsic property of the material 408 or the material 408 may be manufactured to exhibit anisotropy in the magnetic permeability. In any example, the anisotropic magnetic material 408 may be or include different material grades of metal powder cores produced by Fluxtrol, Inc. or Micrometals, Inc., or other soft magnetic metal ribbon or tape wound cores.

The soft magnetic core 404 may be composed of an isotropic magnetic material 410 having a magnetic permeability that does not vary with direction. The magnetic permeability of the soft magnetic core 404 can be made anisotropic by defining one or more annular gaps 406 in the isotropic magnetic material 410, thereby defining annular segments of the isotropic magnetic material 410 that are separated from each other. The annular gaps 406 reduce the magnetic permeability in the direction of the static magnetic field $\vec{B}_0$ in the soft magnetic core 404 compared to the magnetic permeability in the direction of RF magnetic field $\vec{B}_{RF}$.

Numerical modeling may be used to quantify the effect of the anisotropy of the permeability of the soft magnetic cores 402 and 404 on the SNR of a NMR measurement performed using the NMR sensor 300 (FIG. 3). In one test case scenario, the magnetic permeability of the anisotropic material of the soft magnetic cores 402 and 404 in the direction of the static magnetic field $\vec{B}_0$ was assumed to be about ten, while the magnetic permeability in the direction of the RF magnetic field $\vec{B}_{RF}$ was assumed to be about fifty. Compared to an isotropic magnetic material with a magnetic permeability of about ten, the SNR increased when using the soft magnetic cores 402 and 404 in the NMR sensor 300 for analyzing a non-conductive drilling fluid and 1 Ohm-m resistivity rock formation was about 30%. The efficiency of the NMR sensor 300, defined as the SNR per square root of the power loss, was obtained to be about 70%.

Figure 5:
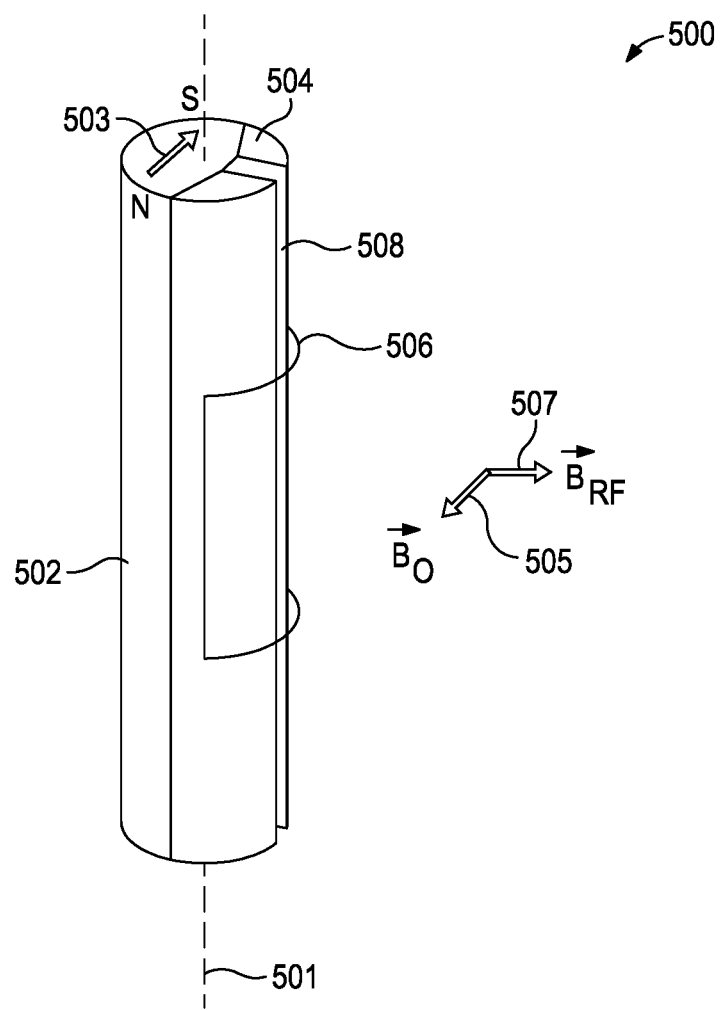
FIG. 5 illustrates an isometric view of another exemplary NMR sensor that may be used in the logging tool of FIG. 2 for obtaining NMR data from a surrounding subterranean formation.

FIG. 5 illustrates an isometric view of another exemplary NMR sensor 500 that may be used in the logging tool 126 of FIG. 2 for obtaining NMR data from a surrounding subterranean formation 106. Although the NMR sensor 500 is disclosed as being used in the wireline system 200, one of skill in the art will appreciate that the NMR sensor 500 can also be used in the drilling system 100 (FIG. 1) and other desired wellbore systems, without departing from the scope of the disclosure. As illustrated, the NMR sensor 500 may provide a generally cylindrical structure that includes a magnet 502, a soft magnetic core 504, and an NMR antenna 506 positioned on or about the outer surface of the soft magnetic core 504. The soft magnetic core 504 is secured to the magnet 502. As illustrated, the magnet 502 and the soft magnetic core 504 may be elongated in the general direction of a longitudinal axis 501 of the NMR sensor 500, and magnet 502 and the soft magnetic core 504 are coupled longitudinally along the longitudinal axis 501. In any example, the NMR antenna 506 may at least partially circumscribe (extend about) the soft magnetic core 504. The magnet 502 may be magnetized in a direction perpendicular to the longitudinal axis 501, as generally indicated by the arrow 503. The soft magnetic core 504 may be or include a magnetic material exhibiting anisotropic magnetic permeability. The magnetic permeability of the magnetic material (and thus the soft magnetic core 504) in the direction of a static magnetic field $\vec{B}_0$, as generally indicated by the arrow 505, is less than the magnetic permeability in the direction of an RF magnetic field $\vec{B}_{RF}$, as generally indicated by the arrow 507. The magnet 502 and the soft magnetic core 504 may be coupled to each other using the internal the attractive forces between them or using desired external means such as fasteners.

During exemplary operation of the NMR sensor 500, the static magnetic field $\vec{B_0}$ is generated by the magnet 502 and the RF magnetic field $\vec{B_{RF}}$ is generated by the NMR antenna 506. In order to reduce the shorting of the magnetic flux in the soft magnetic core 504, an axial non-magnetic gap 508 may be defined longitudinally in at least a portion of the soft magnetic core 504. The axial non-magnetic gap 508 may recue the shorting of the magnetic flux in the soft magnetic core 504 by shape the static magnetic field $\vec{B_0}$ generated by the magnet 502. The axial non-magnetic gap 508 may be filled with a variety of non-magnetic, electrically insulating/ non-conductive materials such as, but not limited to, a high temperature plastic, a thermoplastic, a polymer (e.g., polyimide), a ceramic, an epoxy material, air, or any combination thereof.

Numerical modeling may be used to compare performances of isotropic and anisotropic magnetic materials in terms of their effect on the SNR when performing a NMR measurement using the NMR sensor 500. In one test case scenario, the magnetic permeability of the anisotropic material of the soft magnetic core 504 in the direction of the static magnetic field $\vec{B_0}$ was assumed to be about 23, while the magnetic permeability in the direction of the RF magnetic field $\vec{B_{RF}}$ was assumed to be about 56. Compared to an isotropic material with magnetic permeability of 23, the SNR increase when using the NMR sensor 500 for analyzing a non-conductive bore mud and 1 Ohm-m resistivity rock formation was around 9%. The efficiency of the NMR sensor 500, which may be defined as the SNR per square root of the power loss, was obtained to be about 13%.

In any embodiment of the NMR sensors 300 and 500 disclosed above, the static magnetic field may be kept unchanged from its value when using an isotropic material for the soft magnetic core. Instead, the cross-sectional area of the soft magnetic cores 310 and 504 may be reduced. A reduced cross-sectional area of the soft magnetic core may make the NMR sensors 300 and 500 less expensive, and may result in a simpler and more robust sensor and NMR tool design.

Therefore, the disclosed systems and methods are well adapted to attain the ends and advantages mentioned as well as those that are inherent therein. The particular embodiments disclosed above are illustrative only, as the teachings of the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope of the present disclosure. The systems and methods illustratively disclosed herein may suitably be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the elements that it introduces. If there is any conflict in the usages of a word or term in this specification and one or more patent or other documents that may be incorporated herein by reference, the definitions that are consistent with this specification should be adopted.

As used herein, the phrase "at least one of" preceding a series of items, with the terms "and" or "or" to separate any of the items, modifies the list as a whole, rather than each member of the list (i.e., each item). The phrase "at least one of" allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

What is claimed is:

1. A nuclear magnetic resonance (NMR) sensor, comprising:
   a magnet that generates a static magnetic field;
   a soft magnetic core secured to the magnet; and
   an antenna extending at least partially about the soft magnetic core and generating a radio frequency (RF) magnetic field, wherein the soft magnetic core comprises an anisotropic material having a low magnetic permeability in the direction of the static magnetic field and a high magnetic permeability in the direction of the RF magnetic field.

2. The NMR sensor of claim 1, wherein the direction of the static magnetic field is orthogonal to the direction of the RF magnetic field.

3. The NMR sensor of claim 1, wherein the magnet comprises:
   a central magnetic piece having a first axial end and a second axial end opposite the first axial end;
   a first magnetic end piece positioned at the first axial end; and
   a second magnetic end piece positioned at the second axial end.

4. The NMR sensor of claim 3, wherein the magnet is a permanent magnet and the central magnetic piece and the first and second magnetic end pieces each comprise one or more permanent magnetic pieces.

5. The NMR sensor of claim 1, wherein the antenna comprises a transversal-dipole antenna for generating the RF magnetic field.

6. The NMR sensor of claim 1, wherein the soft magnetic core comprises an isotropic magnetic material having at least one annular gap defined thereon to reduce the magnetic permeability of the soft magnetic core in the direction of the static magnetic field.

7. The NMR sensor of claim 1, wherein an axially extending nonmagnetic gap is defined on at least a portion of an outer surface of the soft magnetic core.

8. A well system, comprising:
   a wellbore drilled through one or more subterranean formations; and a nuclear magnetic resonance (NMR) sensor positioned in the wellbore for obtaining NMR data of the one or more subterranean formations, the NMR sensor including:
a magnet that generates a static magnetic field;
a soft magnetic core secured to the magnet; and
an antenna extending at least partially about the soft magnetic core and generating a radio frequency (RF) magnetic field, wherein the soft magnetic core comprises an anisotropic material having a low magnetic permeability in the direction of the static magnetic field and a high magnetic permeability in the direction of the RF magnetic field.

9. The well system of claim 8, further comprising a drill string extended into the wellbore, wherein the NMR sensor forms part of the drill string.

10. The well system of claim 8, further comprising a cable extended into the wellbore, wherein the NMR sensor is attached to the cable.

11. The well system of claim 8, wherein the magnet comprises:
a central magnetic piece having a first axial end and a second axial end opposite the first axial end;
a first magnetic end piece positioned at the first axial end; and
a second magnetic end piece positioned at the second axial end.

12. The well system of claim 8, wherein the antenna comprises a transversal-dipole antenna for generating the RF magnetic field, a direction of the RF magnetic field being orthogonal to a direction of the static magnetic field.

13. The well system of claim 8, wherein the soft magnetic core comprises an isotropic magnetic material and at least one annular gap is defined on the soft magnetic core to reduce the magnetic permeability of the soft magnetic core in the direction of the static magnetic field.

14. The well system of claim 8, wherein an axially extending nonmagnetic gap is defined on at least a portion of an outer surface of the soft magnetic core and is filled with a non-magnetic material.

15. A method, comprising:
conveying a nuclear magnetic resonance (NMR) sensor into a wellbore drilled through one or more subterranean formations; and
obtaining NMR data from the wellbore using the NMR sensor by generating a static magnetic field using a magnet of the NMR sensor, and generating a radio frequency (RF) magnetic field using an antenna extending at least partially about an anisotropic soft magnetic core that is secured to the magnet, wherein a magnetic permeability of the anisotropic soft magnetic core comprises a low magnetic permeability in the direction of the static magnetic field and a high magnetic permeability in the direction of the RF magnetic field.

16. The method of claim 15, wherein generating the RF magnetic field comprises generating the RF magnetic field in the direction that is orthogonal to the direction of the static magnetic field and by using the antenna that comprises a transversal-dipole antenna to produce circular polarized excitation of the one or more subterranean formations.

17. The method of claim 15, wherein generating the static magnetic field comprises generating the static magnetic field using the magnet that comprises:
a central magnetic piece having a first axial end and a second axial end opposite the first axial end;
a first end magnetic piece positioned at the first axial end; and
a second end magnetic piece positioned at the second axial end.

18. The method of claim 15, further comprising reducing a shorting of a magnetic flux in the soft magnetic core with an axially extending non-magnetic gap defined on at least a portion of an outer surface of the soft magnetic core.

19. A well system, comprising:
a nuclear magnetic resonance (NMR) sensor positioned in a wellbore for obtaining NMR data of one or more subterranean formations, the NMR sensor including:
a magnet that generates a static magnetic field in the one or more subterranean formations, wherein the static magnetic field is substantially parallel to a longitudinal axis of the wellbore;
a soft magnetic core secured to the magnet; and
an antenna extending at least partially about the soft magnetic core and generating a radio frequency (RF) magnetic field, wherein a magnetic permeability of the soft magnetic core in a direction of the static magnetic field is less than the magnetic permeability of the soft magnetic core in a direction of the RF magnetic field.

20. The well system of claim 19, further comprising a drill string extended into the wellbore, wherein the NMR sensor forms part of the drill string.

21. The well system of claim 19, further comprising a cable extended into the wellbore, wherein the NMR sensor is attached to the cable.

22. The well system of claim 19, wherein the magnet comprises:
a central magnetic piece having a first axial end and a second axial end opposite the first axial end;
a first magnetic end piece positioned at the first axial end; and
a second magnetic end piece positioned at the second axial end.

23. The well system of claim 19, wherein the antenna comprises a transversal-dipole antenna for generating the RF magnetic field, a direction of the RF magnetic field being orthogonal to a direction of the static magnetic field and the longitudinal axis of the wellbore.

24. The well system of claim 19, wherein the soft magnetic core comprises an isotropic magnetic material and at least one annular gap is defined on the soft magnetic core to reduce the magnetic permeability of the soft magnetic core in the direction of the static magnetic field and the longitudinal axis of the wellbore.

25. The well system of claim 19, wherein the soft magnetic core comprises an anisotropic magnetic material.

26. The well system of claim 19, wherein an axially extending nonmagnetic gap is defined on at least a portion of an outer surface of the soft magnetic core and is filled with a non-magnetic material.

* * * * *